(12) United States Patent
Tanaka et al.

(10) Patent No.: US 9,006,653 B2
(45) Date of Patent: Apr. 14, 2015

(54) ELECTRON MICROSCOPE

(75) Inventors: Hideki Tanaka, Hitachinaka (JP);
Tsuyoshi Wakuda, Hitachinaka (JP)

(73) Assignee: Hitachi High-Technologies Corporation, Tokyo (JP)

( * ) Notice: Subject to any disclaimer, the term of this patent is extended or adjusted under 35 U.S.C. 154(b) by 0 days.

(21) Appl. No.: 13/984,329

(22) PCT Filed: Feb. 27, 2012

(86) PCT No.: PCT/JP2012/054728
§ 371 (c)(1),
(2), (4) Date: Aug. 8, 2013

(87) PCT Pub. No.: WO2012/117998
PCT Pub. Date: Sep. 7, 2012

(65) Prior Publication Data
US 2013/0313431 A1    Nov. 28, 2013

(30) Foreign Application Priority Data
Feb. 28, 2011 (JP) ................................. 2011-041205

(51) Int. Cl.
*H01J 37/14* (2006.01)
*H01J 37/04* (2006.01)
(Continued)

(52) U.S. Cl.
CPC ................. *H01J 37/04* (2013.01); *H01J 37/09* (2013.01); *H01J 37/14* (2013.01); *H01J 37/16* (2013.01); *H01J 2237/0264* (2013.01)

(58) Field of Classification Search
CPC ....................... H01J 2237/264; H01J 2237/268
USPC ........................................................ 250/310
See application file for complete search history.

(56) References Cited

U.S. PATENT DOCUMENTS 5,023,457 A * 6/1991 Yonezawa ............... 250/396 ML
5,185,530 A * 2/1993 Norioka et al. ............... 250/398
(Continued)

FOREIGN PATENT DOCUMENTS

JP    61-059825 A    3/1986
JP    04-171645 A    6/1992
(Continued)

*Primary Examiner* — Nicole Ippolito
*Assistant Examiner* — Eliza Osenbaugh-Stewart
(74) *Attorney, Agent, or Firm* — Miles & Stockbridge P.C.

(57) ABSTRACT

Provided is an electron microscope capable of enhancing a magnetic shield function even though the structure thereof has an objective tens that projects into a sample chamber space. The electron microscope includes: an objective lens (6) which focuses an electron beam to irradiate a sample (4) with; a sample chamber (5) which forms a sample space to contain the sample (4); a sample chamber magnetic shield (7) provided inside the sample chamber (5); and an objective lens magnetic shield (8) of a tubular shape which surrounds the periphery of the objective lens (6). A first and a second hole, which face to each other in a traveling direction of the electron beam, are provided in an upper plate (10) serving as an upper wall of the sample chamber (5) and in an upper shield (9) of the sample chamber magnetic shield (7). The objective lens (6) is held inside the first hole provided in the upper plate (10). A lower end of the objective lens (6) is disposed at a position lower than a lower end of the upper plate (10), and at a position of the second hole provided in the upper shield (9) or at a position near this position. The objective lens magnetic shield (8) is positioned inside the first hole, and a lower end thereof is connected to the upper shield (9).

16 Claims, 5 Drawing Sheets

(51) Int. Cl.
*H01J 37/09* (2006.01)
*H01J 37/16* (2006.01)

(56) References Cited

U.S. PATENT DOCUMENTS

| | | | |
|---|---|---|---|
| 5,448,064 A | * | 9/1995 | Matsuyama .................. 250/310 |
| 6,730,916 B1 | * | 5/2004 | Tsuji et al. ............... 250/442.11 |
| 7,435,958 B2 | | 10/2008 | Inanobe et al. |
| 2006/0219946 A1 | * | 10/2006 | Inanobe et al. ............ 250/492.1 |

FOREIGN PATENT DOCUMENTS

| | | |
|---|---|---|
| JP | 04-192245 A | 7/1992 |
| JP | 10-106466 A | 4/1998 |
| JP | 2004-214110 A | 7/2004 |

* cited by examiner

FIG.1

(BACKGROUND ART)

ELECTRON MICROSCOPE

TECHNICAL FIELD

The present invention relates to an electron microscope, and in particular, relates to an electron microscope which is highly effective in magnetic shield effect.

BACKGROUND ART

Patent Literature 1 and Patent Literature 2 disclose that in an electron microscope, an aluminum alloy or the like are used in order to reduce the weight of a sample chamber or a column. In both of these Patent Literature the importance of magnetic shield is indicated, and with regard to arrangement of a magnetic shield, it is shown that a ferromagnetic is disposed in an inner surface of a sample chamber and/or a column.

In an electron microscope shown in Patent Literature 3, an objective lens comprising a ferromagnet projects to the vicinity of a sample provided in the center of a sample chamber space. This configuration is for obtaining a high resolution of a microscope.

Conventionally, also in an electron microscope with an objective lens projecting into a sample chamber space as shown in Patent Literature 3, a magnetic shield is disposed so as to be along the inner surface of a sample chamber as shown in Patent Literature 1 and Patent Literature 2.

CITATION LIST

Patent Literature

Patent Literature 1: JP-A-61-059825
Patent Literature 2: JP-A-2004-214110
Patent Literature 3: JP-A-4-171645

SUMMARY OF INVENTION

Technical Problem

As stated above, in a conventional electron microscope, a magnetic shield is disposed along the inner surface of a sample chamber. This magnetic shield has a weak effect with respect to as electron microscope with an objective lens projecting into a sample chamber space. Therefore, with a fluctuation in an environmental magnetic field, the magnetic field intensity in an electron beam trajectory space varies, the position of an electron beam shifts, and/or the electron microscope becomes out of focus.

The present invention is intended to provide an electron microscope capable of enhancing the function of a magnetic shield even if it has a structure where as objective lens projects into a sample chamber space.

Solution to Problem

An electron microscope according to the present invention has the following basic features.

The electron microscope comprises: an electron gun which generates as electron beam; a column which contains the electron gun and a deflection lens; an objective lens which focuses the electron beam to irradiate a sample with; a sample chamber which is positioned under the column and forms a sample space to contain the sample; a sample chamber magnetic shield provided inside the sample chamber; and an objective lens magnetic shield of a tubular shape which surrounds a periphery of the objective lens. A first hole and a second hole, which face to each other in a traveling direction of the electron beam, are provided in an upper plate serving as an upper wall of the sample chamber and in an upper shield of the sample chamber magnetic shield. The objective lens is held inside the first hole provided in the upper plate of the sample chamber among the holes. A lower end of the objective lens is disposed at a position lower than a lower end of the upper plate of the sample chamber, and at a position of the second hole provided in the upper shield of the sample chamber magnetic shield or at a position near this position. The sample is installed at a position facing the second hole, inside the sample chamber magnetic shield. The objective lens magnetic shield is positioned inside the first hole, and a lower end thereof is connected to the upper shield of the sample chamber magnetic shield.

Advantageous Effects of Invention

With the present invention, an electron microscope which is high in the function of the magnetic shield and is tolerable to a fluctuation in an environmental magnetic field can be provided.

Other objects, features, and advantages of the invention will become apparent from the following description of the embodiments of the invention taken in conjunction with the accompanying drawings.

DESCRIPTION OF EMBODIMENTS

Figure 1:
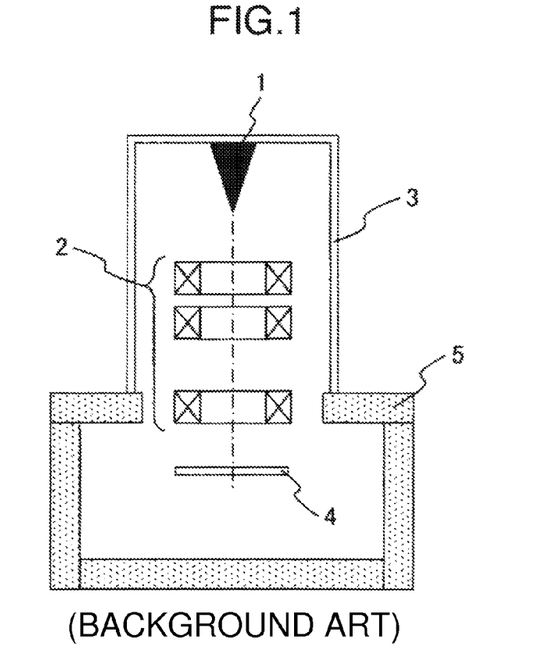
FIG. 1 is a cross-sectional view showing a schematic of the configuration of an ordinary electron microscope.

FIG. 1 is a cross-sectional view showing a schematic of the configuration of an ordinary electron microscope. The electron microscope has a function to deflect and focus an electron beam generated by an electron gun 1 with a lens (a deflection lens and an objective lens) 2 and irradiate a sample 4 with the resulting beam. A column 3 for containing and holding the electron gun 1, the lens 2, and the like often has a magnetic shield effect. The sample 4 is contained in a sample chamber 5 that is a vacuum container. The sample 4 emits secondary electrons when irradiated with an electron beam. The secondary electrons are captured by a secondary electron detection section (not shown) and thereby the sample 4 is inspected and/or imaged. The sample 4 moves in the sample chamber 5 with a driving stage (not shown), thereby allowing for the inspection/imaging of the sample 4 at various positions. Movable components among those constituting the driving stage are preferably configured with nonmagnetic material.

In the figures described in respective embodiments below, the same numerals as those of FIG. 1 designate elements the same as or common to those of FIG. 1. Moreover, along the irradiation direction of the electron beam, the direction from the sample 4 toward the electron gun 1 is defined as upward, and the direction from the electron gun 1 toward the sample 4 is defined as downward. Hereinafter, the positional relationship in the vertical direction between objects shall follow this definition.

The major features of the electron microscope according to the present invention are as follows. A sample is surrounded by a sample chamber magnetic shield provided inside a sample chamber, and the periphery of an objective lens is surrounded by a tubular objective lens magnetic shield. The sample chamber magnetic shield is disposed so that a lower end of an upper portion (upper shield) thereof is at the same height or substantially the same height as a lower end of the objective lens. The objective lens magnetic shield is connected to the sample chamber magnetic shield.

The features of the electron microscope according to the present invention are described in more detail as follows. A first hole is provided in an upper plate serving as an upper wall of the sample chamber, and a second hole is provided in an upper shield of the sample chamber magnetic shield, wherein the first hole and the second hole face to each other in the travelling direction of the electron beam. The objective lens is held inside the first hole, and the lower end of the objective lens is placed at a position lower than the lower end of the upper plate of the sample chamber, and also at a position of the second hole or at a position near this position. The sample is installed at a position facing the second hole, inside the sample chamber magnetic shield. The objective lens magnetic shield is positioned inside the first hole, and the lower end thereof is connected to the upper shield of the sample chamber magnetic shield.

Hereinafter, embodiments of the electron microscope according to the present invention are described using examples. In the following examples, items other than the purposes and the features of the present invention described above are also disclosed, and the features and the effects of each embodiment are described each time. Note that, "nonmagnetic" used hereinafter shall refer to a characteristic of a material with relative permeability in a range from 0.99 to 1.01 (Inclusive), while "ferromagnetic" shall refer to a characteristic of a material with relative permeability greater than 1.01.

Moreover, the shape of the objective lens is not limited to the shapes described in the following examples and dm figures. In the following examples, an objective lens of a typical shape for which magnetic shield is difficult is exemplified.

Embodiment 1

Figure 2:
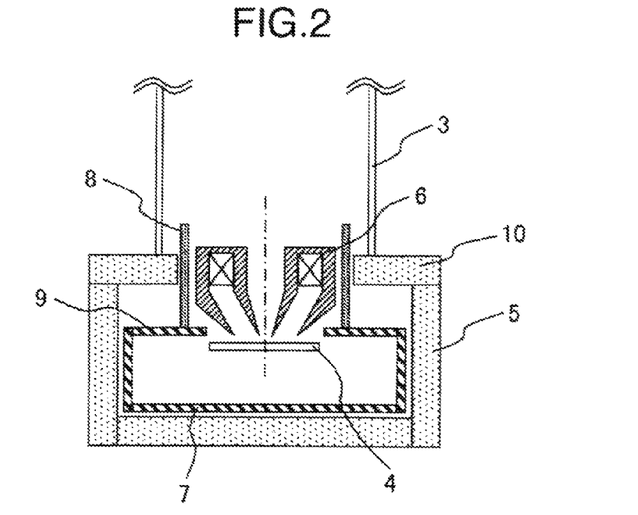
FIG. 2 is a cross-sectional view around a sample chamber of an electron microscope according to Embodiment 1.
Figure 3:
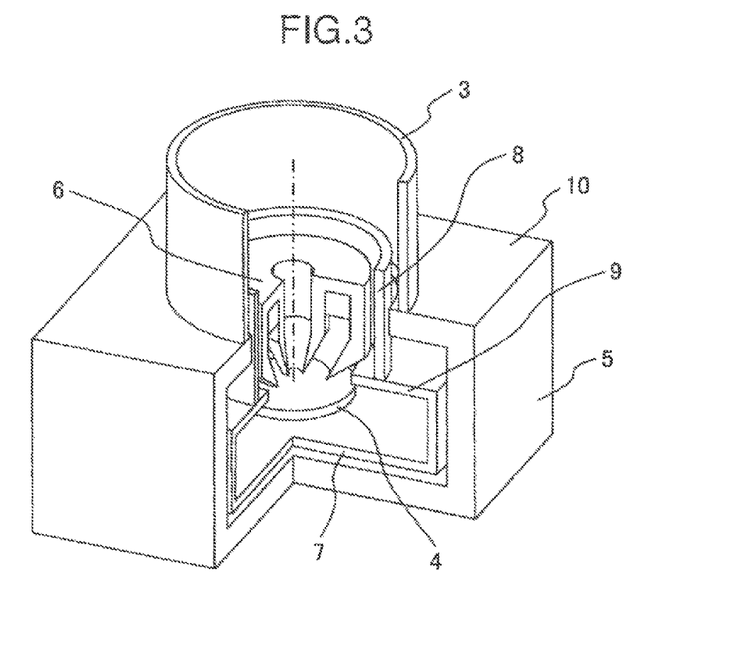
FIG. 3 is a perspective view around the sample chamber of the electron microscope according to Embodiment 1 (this cross section differs from that of FIG. 2)

FIG. 2 and FIG. 3 show schematics of an electron microscope according to an embodiment of the present invention. FIG. 2 is a cross-sectional view around a sample chamber of the electron microscope according to Embodiment 1, and FIG. 3 is a perspective view around the sample chamber of the electron microscope according to Embodiment 1. FIG. 3 differs from FIG. 2 in the position of the cross section.

Among the lenses constituting the electron microscope, an objective lens 6 is typically disposed above the sample 4, has a substantially rotationally symmetric shape, with the irradiation direction of the electron beam as the axis direction, and is made from a ferromagnet such as iron. In order to enhance the imaging resolution of the electron microscope, the objective lens 6 with a shape as shown in FIG. 2 is used. The characteristic of the objective lens 6 is that a lower end (a tip on the side of the sample 4) projects into an internal space of the sample chamber 5 (the sample chamber space) so as to be closer to the sample 4.

The sample chamber 5 generally has a box shape with a hole in an upper (on the side of the electron gun) container wall, and surrounds the sample 4 together with the objective lens 6 positioned at this hole. Hereinafter, the upper (on the side of the electron gun) container wall is referred to as a sample chamber upper plate 10. Because the lower end of the objective lens 6 projects into the internal space of the sample chamber 5, it is disposed at a position lower than the lower end of the sample chamber upper plate 10 (a position on the side of the sample 4). As described above, in order to reduce the weight, the sample chamber 5 needs to be made from a nonmagnetic material such as an aluminum alloy.

In the sample chamber 5, a sample chamber magnetic shield 7 surrounding the sample is disposed. The sample chamber magnetic shield 7 comprises a thin plate of a ferromagnet such as an iron-nickel alloy, and has a box shape. Hereinafter, the upper portion (on the side of the electron gun) of the sample chamber magnetic shield 7 is referred to as an upper shield 9. A hole is provided in the upper shield 9 so as not to contact the objective lens 6, and the lower end of the objective lens 6 is disposed at the position of this hole. Accordingly, the sample chamber magnetic shield 7 surrounds the sample 4 together with the lower end of the objective lens 6. It is disposed so that the position in the height direction (the irradiation direction of the electron beam) of the lower end of the upper shield 9 becomes the same position or substantially the same position as the lower end (the tip) of the objective lens 6.

Because the lower end of the objective lens 6 projects into the internal space of the sample chamber 5, a space is formed between the upper shield 9 of the sample chamber magnetic shield 7 and the sample chamber upper plate 10 of the sample chamber 5. That is, the upper shield 9 is disposed so as to be separated from the sample chamber upper plate 10 with a prescribed gap in the vertical direction (in the irradiation direction of the electron beam). This prescribed gap can be determined according to the position of the lower end of the objective lens 6.

An objective lens magnetic shield 8 is disposed around the objective lens. The objective lens magnetic shield 8 surrounds the objective lens 6, and has a tube-like shape with the Irradiation direction of the electron beam as its axial direction, and the lower end thereof is connected with the upper shield 9 of the sample chamber magnetic shield 7. Preferably, the objective lens magnetic shield 8 also comprises a thin plate of a ferromagnet such as an iron-nickel alloy and is not brought into contact with the objective lens 6.

In this embodiment, as shows in FIG. 2, the tip of the objective lens 6 projects into the sample chamber space (the internal space of the sample chamber 5) at a relatively acute angle with respect to the irradiation direction of the electron beam, so that the upper shield 9 of the sample chamber magnetic shield 7 can be extended toward the central axis of the column 3 and brought closer to the objective lens 6. In this case, the hole provided in the upper shield 9 is smaller than the diameter of the objective lens magnetic shield 8.

Incidentally, the sample 4 typically moves in the horizontal direction (the direction perpendicular to the irradiation direction of the electron beam) and, therefore, a case is shown, where the upper shield 9 of the sample chamber magnetic shield 7 is disposed horizontally (perpendicularly with respect to the irradiation direction of the electron beam), in this embodiment.

Figure 4:
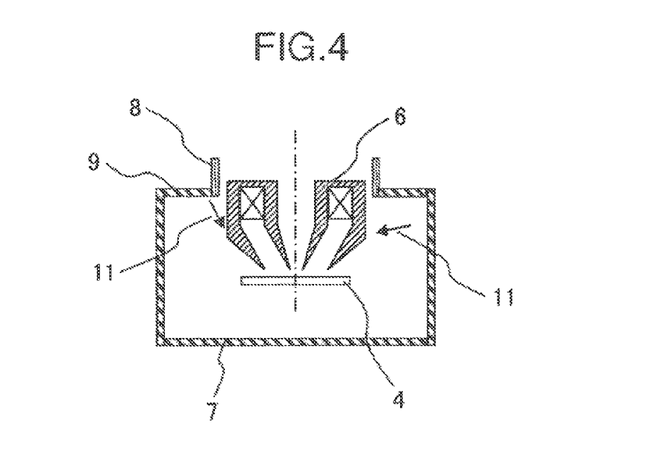
FIG. 4 is a cross-sectional view around a sample chamber of an electron microscope in a comparative example.

FIG. 4 is a cross-sectional view around a sample chamber of an electron microscope in a comparative example with respect to this embodiment. As the comparative example, an electron microscope is shown in FIG. 4, in which the position in the height direction of the upper shield 9 of the sample chamber magnetic shield 7 is located toward the top of the objective lens 6.

Because the objective lens 6 is made from a ferromagnet, a magnetic flux would pass through it than through the sample chamber space. Therefore, a magnetic flux leaking from the magnetic shield (the sample chamber magnetic shield 7 and/or the objective lens magnetic shield 8) into the interior of the sample chamber becomes a magnetic flux 11 toward the objective lens 6. As a result a change in the electron beam trajectory associated with a change in an environmental magnetic field would easily occur.

On the other hand, in the present embodiment, as shown in FIG. 2, the magnetic shield (the objective lens magnetic shield 8 and/or the upper shield 9) of a ferromagnet is disposed near the objective lens 6, so that the magnetic flux 11 toward the objective lens 6 can be relatively reduced.

With the use of a magnetic-field analysis simulation using a finite element method, a case where the upper shield 9 of the sample chamber magnetic shield 7 is disposed at the position of a lower end of the objective lens 6 is compared with a case where it is disposed 150 mm above this position. As a result of evaluating a magnetic field variation associated with a change in an environmental magnetic field at the position of the electron beam trajectory directly above the sample, it is verified that the magnetic field variation is lower by approximately 20% when the upper shield 9 is disposed at the position of the lower end of the objective lens 6 and thus the magnetic shield characteristic is excellent.

Embodiment 2

In the respective embodiments shown below, only differences from Embodiment 1 are described. Moreover, in the figures described below, the same numerals as those of FIG. 2 designate elements the same as or common to those of FIG. 2.

Figure 5:
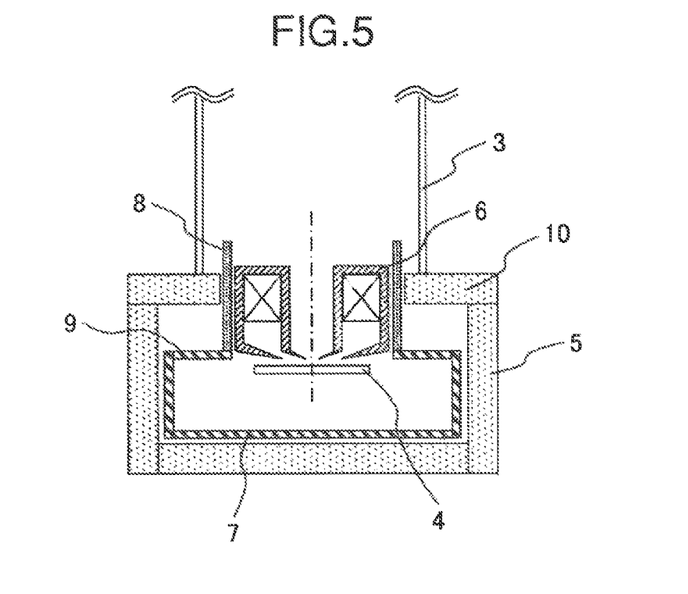
FIG. 5 is a cross-sectional view around a sample chamber of an electron microscope according to Embodiment 2.

FIG. 5 is a cross-sectional view around a sample chamber of an electron microscope according to Embodiment 2. In this embodiment, the tip of the objective lens 6 projects into the sample chamber space (the internal space of the sample chamber 5) at an angle near horizontal (perpendicular to the irradiation direction of the electron beam). That is, this is an example, in which the tip of the objective lens 6 projects into the sample chamber space relatively horizontally as compared with Embodiment 1.

In Embodiment 1, the hole provided in the upper shield 9 of the sample chamber magnetic shield 7 is smaller than the diameter of the objective lens magnetic shield 8; in the case of this embodiment, on the other hand, the hole provided in the upper shield 9 is substantially equal to the diameter of the objective lens magnetic shield 8.

In this manner, the objective lens magnetic shield 8 and the upper shield 9 in the present invention can be applied to any electron microscope regardless of the shape of the tip of the objective lens 6 by changing the diameter of the hole of the upper shield 9.

Embodiment 3

Figure 6:
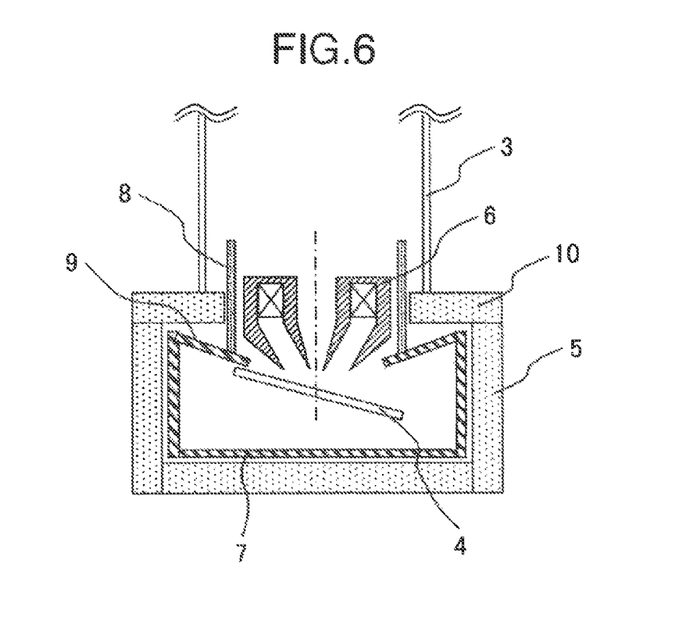
FIG. 6 is a cross-sectional view around a sample chamber of an electron microscope according to Embodiment 3.

FIG. 6 is a cross-sectional view around a sample chamber of an electron microscope according to Embodiment 3. In this embodiment, with a sample driving stage (not shown), the tilt of the sample 4 is variable.

Conventionally, in order to avoid interference between the magnetic shields and the tilted sample 4, a space surrounded by the magnetic shield was kept large, as with the sample chamber of the comparative example shown in FIG. 4.

In this embodiment, the upper shield 9 of the sample chamber magnetic shield 7 is to take a form of a side surface of a circular cone or a polygonal cone, which is convex downwardly, with a hole in a lower end thereof; thereby preventing the interference with the tilted sample 4. At a plane nearest to the objective lens 6 (at the lower end of the shape of the circular cone or the polygonal cone), the upper shield 9 is set at the position in the height direction equal to the position of the lower end of the objective lens 6. Then, the objective lens magnetic shield 8 is connected to the upper shield 9 of the sample chamber magnetic shield 7. With such a configuration, a high magnetic shield characteristic can be obtained.

Embodiment 4

Figure 7:
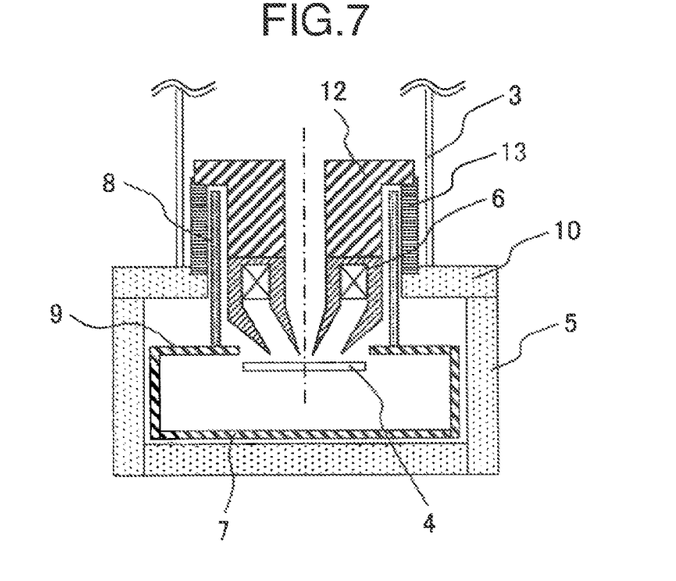
FIG. 7 is a cross-sectional view around a sample chamber of an electron microscope according to Embodiment 4.

FIG. 7 is a cross-sectional view around a sample chamber of an electron microscope according to Embodiment 4. In this embodiment, a support structure of the objective lens 6 is shown.

As shown in FIG. 7, the objective lens 6 is supported by a support structure 12, and, furthermore, the support structure 12 is supported by the sample chamber upper plate 10 via a support flange 13. The support flange 13 is provided in an upper portion of the sample chamber upper plate 10. The support structure 12 and the support flange 13 are disposed so that a space is formed therebetween. By making the support flange 13 long in the vertical direction (the irradiation direction of the electron beam), the position of a contact between the support flange 13 and the support structure 12 is set sufficiently higher than the position of the upper end of the objective lens 6.

For the objective lens magnetic shield 8, the upper portion thereof is positioned in the space between the support flange 13 and the support structure 12, and the lower portion thereof is connected to the upper shield 9 of the sample chamber magnetic shield 7. The position of the upper end of the objective lens magnetic shield 8 is above the position of the upper end of the objective lens 6. Moreover, the objective lens magnetic shield 8 can be configured from one ferromagnetic thin plate.

With such a configuration, the objective lens magnetic shield 8 can shield the objective lens 6, as a single piece from the position above the upper end of the objective lens 6 to the position of the lower end, thus providing a high magnetic shield effect.

Embodiment 5

Figure 8:
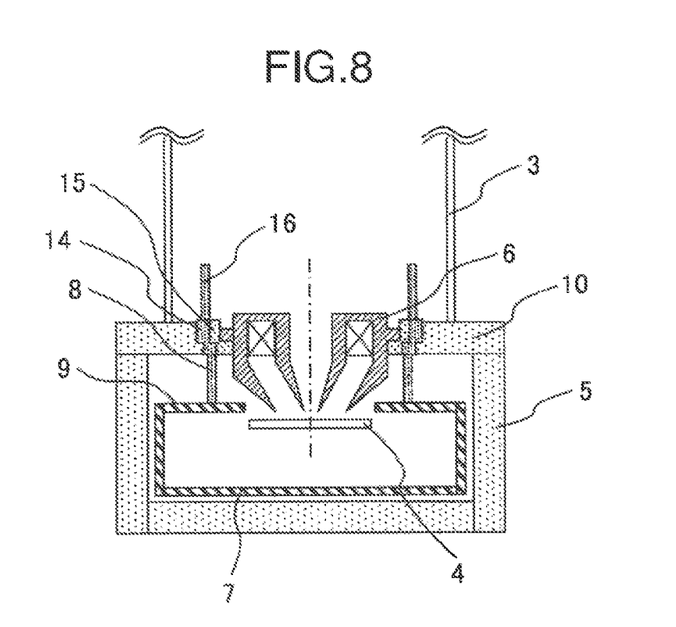
FIG. 8 is a cross-sectional view around a sample chamber of an electron microscope according to Embodiment 5.

FIG. 8 is a cross-sectional view around a sample chamber of an electron microscope in Embodiment 5. In this embodiment, a support structure of the objective lens 6 different from Embodiment 4 is shown.

As shown in FIG. 8, the objective lens 6 is supported onto the sample chamber upper plate 10 via a nonmagnetic flange 15 and a ferromagnetic flange 14. Specifically, the ferromagnetic flange 14 is disposed in the hole of the sample chamber upper plate 10, and the nonmagnetic flange 15 is disposed on the ferromagnetic flange 14 and supports the objective lens 6. Furthermore, the objective lens magnetic shield 8 and an upper objective lens magnetic shield 16 are disposed so as to be connected to the ferromagnetic flange 14.

The upper objective lens magnetic shield 16 is configured from a thin plate of a ferromagnet such as an iron-nickel alloy as with the objective lens magnetic shield 8. The objective lens magnetic shield 8, the ferromagnetic flange 14, and the upper objective lens magnetic shield 16 may comprise the same ferromagnetic material or may comprise different ferromagnetic materials.

Since the ferromagnetic flange 14 is connected to the objective lens magnetic shield 8 and the upper objective lens magnetic shield 16, the objective lens magnetic shield 8, the ferromagnetic flange 14, and the upper objective lens magnetic shield 16 form a shape comprising a contiguous ferromagnet. Furthermore, because the objective lens 6 and the ferromagnetic flange 14 do not contact to each other doe to the nonmagnetic flange 15 and thus the objective lens 6 is not in contact with the magnetic shields, this configuration has a high magnetic shield effect. Moreover, this configuration also has an advantage of facilitating assembly of the electron microscope.

Note that, in this embodiment, the objective lens magnetic shield 8, the ferromagnetic flange 14, and the upper objective lens magnetic shield 16 are shown as separate components, but some or all of them may be formed as a single piece.

Embodiment 6

Figure 9:
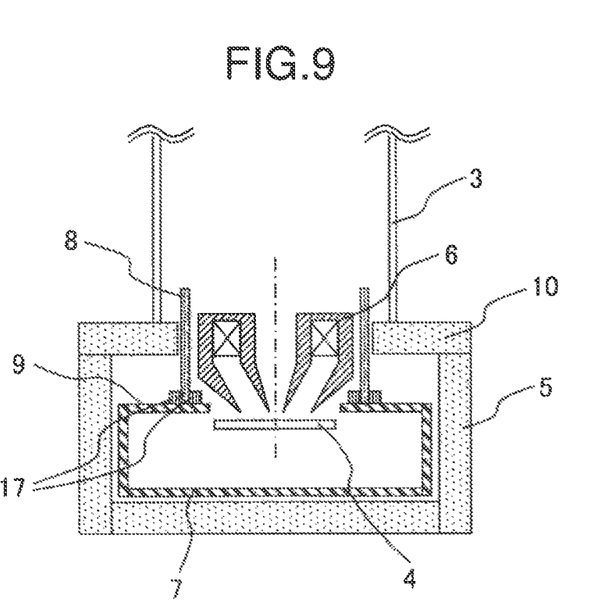
FIG. 9 is a cross-sectional view around a sample chamber of an electron microscope according to Embodiment 6.

FIG. 9 is a cross-sectional view around a sample chamber of an electron microscope according to Embodiment 6. In this embodiment a ferromagnetic ring 17 is disposed in a portion connecting the upper shield 9 of the sample chamber magnetic shield 7 and the objective lens magnetic shield 8.

The ferromagnetic ring 17 is coaxial with the objective lens magnetic shield 8, and can be disposed on the outside, the inside, or both the outside and inside of the objective lens magnetic shield 8 so as to be along the objective lens magnetic shield 8. FIG. 9 shows a case where the ferromagnetic rings 17 are disposed on both the outside and inside of the objective lens magnetic shield 8. By disposing the ferromagnetic rings 17, a magnetic flux leaking at the portion connecting the upper shield 9 and the objective lens magnetic shield 8 can be reduced, thus further enhancing the magnetic shield effect.

The ferromagnetic ring 17, as with the objective lens magnetic shield 8, is configured from a thin plate of a ferromagnet such as an iron-nickel alloy. The ferromagnetic ring 17, the objective lens magnetic shield 8, and the upper shield 9 may comprise the same ferromagnetic material or may comprise different ferromagnetic materials.

Note that, in this embodiment, the upper shield 9, the objective lens magnetic shield 8, and the ferromagnetic ring 17 are shown as separate components, but some or all of them may be formed into a single piece.

Embodiment 7

As stated before, the upper shield 9 is disposed so that the position of the lower end thereof in the height direction (the irradiation direction of the electron beam) becomes the same position or substantially the same position as the lower end (the tip) of the objective lens 6. Accordingly the position of the lower end of the objective lens magnetic shield 8 connected to the upper shield 9 is also the same position or substantially the same position as the lower end of the objective lens 6.

In this embodiment, the position of the lower end of the objective lens magnetic shield 8 is specifically described. The lower end of the objective lens magnetic shield 8 is most preferably disposed within 3 mm above (in the direction toward the electron gun of) the lower end of the objective lens 6. However, when this arrangement is difficult, it is preferably disposed within 10 mm above the lower end of the objective lens 6. It needs to be disposed at least within 30 mm above the lower end of the objective lens 6.

Embodiment 8

In general, the objective lens magnetic shield 8 has a cylindrical shape because the shape of the objective lens 6 is an axisymmetric shape. However, the shape of the objective lens magnetic shield 8 is not limited to the cylindrical shape. For example, it may be a substantially cylindrical shape, in which a solid plate is rounded and the opposite sides are adjoined with each other for the joint portions to overlap, or may be a polygonal tube.

The ferromagnetic ring 17 described in Embodiment 6 shall have a shape following the objective lens magnetic shield 8 even when the objective lens magnetic shield 8 is not in a cylindrical shape. Namely, the shape of the ferromagnetic ring 17 is changed in accordance with the shape of the objective lens magnetic shield 8. For example, when the objective lens magnetic shield 8 is a polygonal tube, the ferromagnetic ring 17 shall have a polygonal ring shape.

Moreover, the sample chamber magnetic shield 7 has a box shape because the sample chamber 5 has a box shape, in general. However, the shape of the sample chamber magnetic shield 7 is not limited to a box shape. For example, it may be a cylindrical shape with lids attached to the top and the bottom thereof or a polygonal box shape. However, the interference with the objective lens 6 needs to be avoided.

It should be further understood by those skilled in the art that although the foregoing description has been made on embodiments of the invention, the invention is not limited thereto and various changes and modifications may be made without departing from the spirit of the invention and the scope of the appended claims.

REFERENCE SIGNS LIST

1 electron gun
2 lens
3 column
4 sample
5 sample chamber
6 objective lens
7 sample chamber magnetic shield
8 objective lens magnetic shield
9 upper shield
10 sample chamber upper plate
11 magnetic flux toward the objective lens
12 column
13 support flange
14 ferromagnetic flange
15 nonmagnetic flange
16 upper objective lens magnetic shield
17 ferromagnetic ring

The invention claimed is:

1. An electron microscope, comprising:
   an electron gun which generates an electron beam;
   a column which contains the electron gun and a lens;
   an objective lens which focuses the electron beam to irradiate a sample;
   a sample chamber which is positioned under the column and forms a sample space to contain the sample;
   a sample chamber magnetic shield provided inside the sample chamber; and
   an objective lens magnetic shield of a tubular shape which surrounds a periphery of the objective lens, wherein a first hole and a second hole, which face to each other in a traveling direction of the electron beam, are provided in an upper plate serving as an upper wall of the sample chamber and in an upper shield of the sample chamber magnetic shield, respectively, wherein the upper plate and the upper shield are separated from each other in the traveling direction by a prescribed gap, wherein the objective lens is held inside the first hole provided in the upper plate of the sample chamber, wherein a lower end of the objective lens is disposed at a position lower than a lower end of the upper plate of the sample chamber and proximate to the second hole provided in the upper shield of the sample chamber magnetic shield, wherein the sample is installed at a position facing the second hole, inside the sample chamber magnetic shield, and wherein the objective lens magnetic shield is positioned inside the first hole, extends along the prescribed gap and has a lower end that is connected to the upper shield of the sample chamber magnetic shield.

2. The electron microscope according to claim 1, wherein the sample chamber magnetic shield is disposed so that the upper shield thereof is perpendicular with respect to an irradiation direction of the electron beam.

3. The electron microscope according to claim 2, further comprising a ring-shaped member comprising a ferromagnet along the objective lens magnetic shield in a portion connecting the sample chamber magnetic shield and the objective lens magnetic shield.

4. The electron microscope according to claim 1, wherein the sample chamber magnetic shield is formed so that the upper shield thereof is in a form of a side surface of a circular cone or a polygonal cone, which is convex downwardly, with a hole in a lower end thereof.

5. The electron microscope according to claim 4, further comprising a ring-shaped member comprising a ferromagnet along the objective lens magnetic shield in a portion connecting the sample chamber magnetic shield and the objective lens magnetic shield.

6. The electron microscope according to claim 1, wherein an end of the objective lens magnetic shield proximate to the electron gun is closer to the electron gun than an end of the objective lens proximate to the electron gun.

7. The electron microscope according to claim 6 wherein the objective lens magnetic shield is configured out of a single component from an end on a side of the sample to an end on a side of the electron gun.

8. The electron microscope according to claim 7, further comprising a ring-shaped member comprising a ferromagnet along the objective lens magnetic shield in a portion connecting the sample chamber magnetic shield and the objective lens magnetic shield.

9. The electron microscope according to claim 6, wherein the objective lens magnetic shield is configured out of a plurality of components from an end on a side of the sample to an end on a side of the electron gun.

10. The electron microscope according to claim 9, further comprising a ring-shaped member comprising a ferromagnet along the objective lens magnetic shield in a portion connecting the sample chamber magnetic shield and the objective lens magnetic shield.

11. The electron microscope according to claim 6, wherein the prescribed gap is determined according to a position of a tip of the objective lens on a side of the sample.

12. The electron microscope according to claim 11, further comprising a ring-shaped member comprising a ferromagnet along the objective lens magnetic shield in a portion connecting the sample chamber magnetic shield and the objective lens magnetic shield.

13. The electron microscope according to claim 6, further comprising a ring-shaped member comprising a ferromagnet along the objective lens magnetic shield in a portion connecting the sample chamber magnetic shield and the objective lens magnetic shield.

14. The electron microscope according to claim 1, wherein the upper prescribed gap is determined according to a position of a tip of the objective lens on a side of the sample.

15. The electron microscope according to claim 14, further comprising a ring-shaped member comprising a ferromagnet along the objective lens magnetic shield in a portion connecting the sample chamber magnetic shield and the objective lens magnetic shield.

16. The electron microscope according to claim 1, further comprising a ring-shaped member comprising a ferromagnet along the objective lens magnetic shield in a portion connecting the sample chamber magnetic shield and the objective lens magnetic shield.

* * * * *